United States Patent [19]

Peterson

[11] Patent Number: 4,517,662
[45] Date of Patent: May 14, 1985

[54] HIGH-SPEED, COMPACT MAGNETIC BUBBLE STRETCHER

[75] Inventor: LuVerne R. Peterson, San Diego, Calif.

[73] Assignee: Burroughs Corporation, Detroit, Mich.

[21] Appl. No.: 508,946

[22] Filed: Jun. 29, 1983

[51] Int. Cl.³ .............................. G11C 19/08
[52] U.S. Cl. ............................ 365/44; 365/8
[58] Field of Search ...................... 365/8, 39, 44

[56] References Cited

FOREIGN PATENT DOCUMENTS 2504758 8/1976 Fed. Rep. of Germany .......... 365/8

Primary Examiner—James W. Moffitt

Attorney, Agent, or Firm—Charles J. Fassbender; Kevin R. Peterson

[57] ABSTRACT

A magnetic bubble memory (of the type that has a magnetic film, a plurality of magnetic bubbles in the film, and an insulating layer over the film) includes an improved electromagnetic structure on the insulating layer for stretching the bubbles to aid in their detection; which structure is comprised of a plurality of elongated permalloy elements on the insulator and arranged in spaced apart rows with only one of the elements per row; each element has a pattern that is X-shaped which repeats along the element in the direction of elongation; the X in the pattern has two short legs and two long legs; and the pattern is repeated such that the short legs of one X join with the long legs of the next X.

10 Claims, 3 Drawing Figures

HIGH-SPEED, COMPACT MAGNETIC BUBBLE STRETCHER

BACKGROUND OF THE INVENTION

This invention relates to magnetic bubble memories; and in particular, it relates to mechanisms in such memories for stretching magnetic bubbles prior to their detection.

In a magnetic bubble memory, a planar film of magnetic material is provided in which the magnetic bubbles are formed by a magnetic field that is oriented perpendicular to the plane of the film. An insulating layer is disposed over the film of magnetic material; and a plurality of bubble propagate elements, such as a plurality of asymmetric chevrons, are disposed on the insulating layer to define paths beneath which the magnetic bubbles move. Those bubbles move in response to another magnetic field that rotates in the plane of the propagate elements.

In order to read information from the bubble memory, a sensing mechanism is also provided on the insulating layer to detect the presence (or absence) of the magnetic bubbles. This mechanism includes a magnetostrictive sensing element which changes its resistance as a magnetic bubble is propagated beneath the element. However, the resistance changes are quite small; and so the bubbles are stretched before they are passed under the sensing element in order to avoid errors in their detection.

In other words, the magnitude of the resistance change that is induced into the magnetostrictive sensing element is proportional to the size of the bubble which passes underneath that element. Thus, in a bubble memory, a stretching mechanism is conventionally provided between the bubble propagate elements and the magnetostrictive sensing element to increase the size of the bubbles before they are sensed.

One desirable feature of the bubble stretching mechanism is that the amount by which it stretches a bubble for each rotation of the in-plane rotating magnetic field be relatively large. This is because each rotation of that field takes a certain amount of time; so reducing the number of rotations that are required to stretch the bubble to a given length directly increases the speed at which the bubble is sensed.

Another desirable feature of the bubble stretching mechanism is that it occupies a reduced amount of space. This is because by reducing the space which the stretching mechanism occupies, more space is available for additional propagate elements; and thus the total number of bubbles that can be stored in the memory (i.e., the memory storage capacity) is increased.

Accordingly, a primary object of the invention is to provide an improved mechanism for stretching bubbles in a magnetic bubble memory.

Another object of the invention is to provide a mechanism for stretching bubbles with improved speed.

Still another object of the invention is to provide a mechanism for stretching bubbles in a reduced amount of space.

BRIEF SUMMARY OF THE INVENTION

In the present invention, the above objects and others are achieved by a magnetic bubble memory of the type that includes a planar magnetic film containing magnetic bubbles, an insulating layer over the film, and an improved electromagnetic structure on the insulating layer for stretching the bubbles to aid in their detection—wherein the improved structure for stretching the bubbles is comprised of a plurality of elongated permalloy elements which are arranged on the insulating layer in spaced apart rows with only one of the elements per row; each element has a pattern that is X-shaped which repeats along the element in the direction of elongation; the X in each pattern has two short legs and two long legs; and the X pattern repeats such that the short legs of one X join the long legs of the next X.

Preferably, the length of each elongated permalloy element is at least one hundred times the width; and the number of X's joined in each permalloy element is at least one hundred. Also preferably, the short legs of the X's in the permalloy element are less than half the length of the long legs; and the short legs of the X's join the long legs of the next X at about midway along the long legs. Suitably, the short and long legs of each X intersect at 90°.

BRIEF DESCRIPTION OF THE DRAWINGS

Various features and advantages of the invention are described in the following Detailed Description in conjunction with the accompanying drawings wherein.

DETAILED DESCRIPTION OF THE INVENTION

Figure 1:
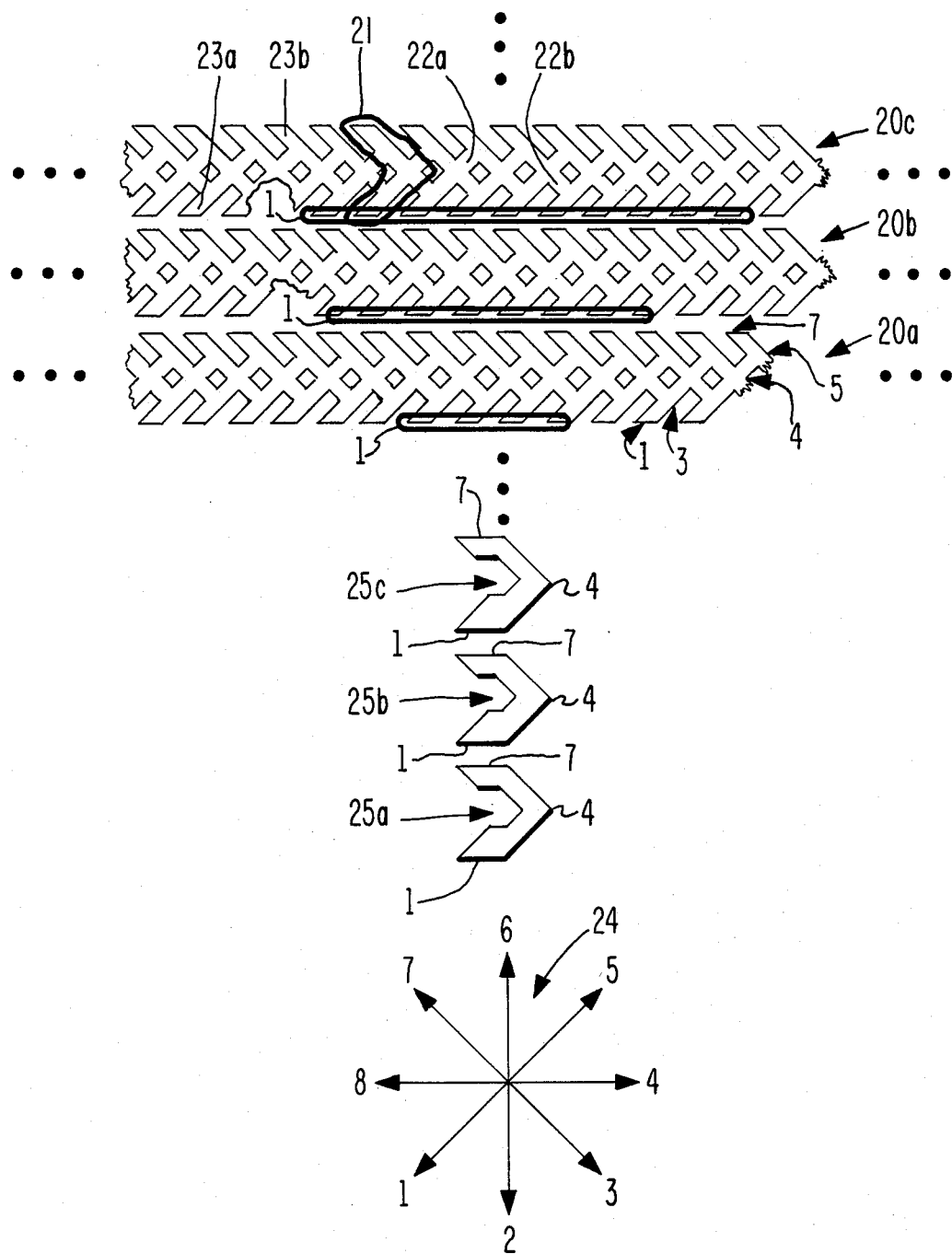
FIG. 1 is a top plan view of the improved structure which is constructed according to the invention for stretching magnetic bubbles.

Referring now to FIG. 1, it shows the top view of a portion of three elongated permalloy elements 20a, 20b, and 20c which are constructed according to the invention. Elements 20a–20c are identical to each other; and they are arranged in spaced apart rows with only one element per row.

Each of the elements 20a–20c is made of an X-shaped pattern 21 which repeats in the direction of the elongation. In FIG. 1, a sequence of three dots ( . . . ) indicates that the pattern 21 continues off of the page. Preferably, the length of each of the elements 20a–20c is at least one hundred times the width; and the number of X's joined in each of the elongated permalloy elements is at least one hundred. For example, each of the elements 20a–20c may be 4,000 um by 12 um and include over three hundred X's.

Each X in pattern 21 has two short legs 22a and 22b and two long legs 23a and 23b; and the pattern 21 repeats such that the short legs of one X join with the long legs of the next adjacent X. In the FIG. 1 embodiment, the legs of the X's in elements 20a–20c intersect at 90°; the short legs 22a–22b are less than half the length of the long legs 23a–23b; and the short legs 22a–22b join the long legs 23a–23b at or near their midpoint.

Elements 20a–20c operate in a magnetic bubble memory to stretch the bubbles prior to their detection. To that end, elements 20a–20c are formed in the memory on top of an insulating layer (not shown) which lies in the plane of FIG. 1; and that insulating layer is formed on top of a magnetic film (not shown) which contains the bubbles also lies in the plane of FIG. 1.

A plurality of asymmetric chevrons 25a–25c are also disposed on the insulating layer to provide a path which leads the bubbles into the elements 22a–22c. Those bubbles move beneath the chevrons in response to a rotating magnetic field 24; and then they move beneath elements 20a–20c in response to field 24 whereupon they are stretched.

Reference numerals 1–8 indicate the position of field 24 at various time instants; and those same reference numerals indicate the corresponding position of the magnetic bubbles as they move beneath the chevrons 25a–25c and the stretching elements 20a–20c. For example, when field 24 is in position 1, respective bubbles lie at position 1 beneath chevrons 25a–25c; and respective stretched bubbles lie at position 1 beneath the stretching elements 20a–20c.

Each successive stretching element 20a, 20b, and 20c causes the bubbles to stretch longer and longer. Thus, the total length to which a bubble is stretched is proportional to the total number of stretching elements (i.e., the total number of rows).

Suitably, thirty rows of the elements 20a–20c are provided in a bubble memory. Also, the number of X's that are joined in each particular element must be sufficient to make that element at least as long as the length to which that element stretches the bubble.

Figure 2:
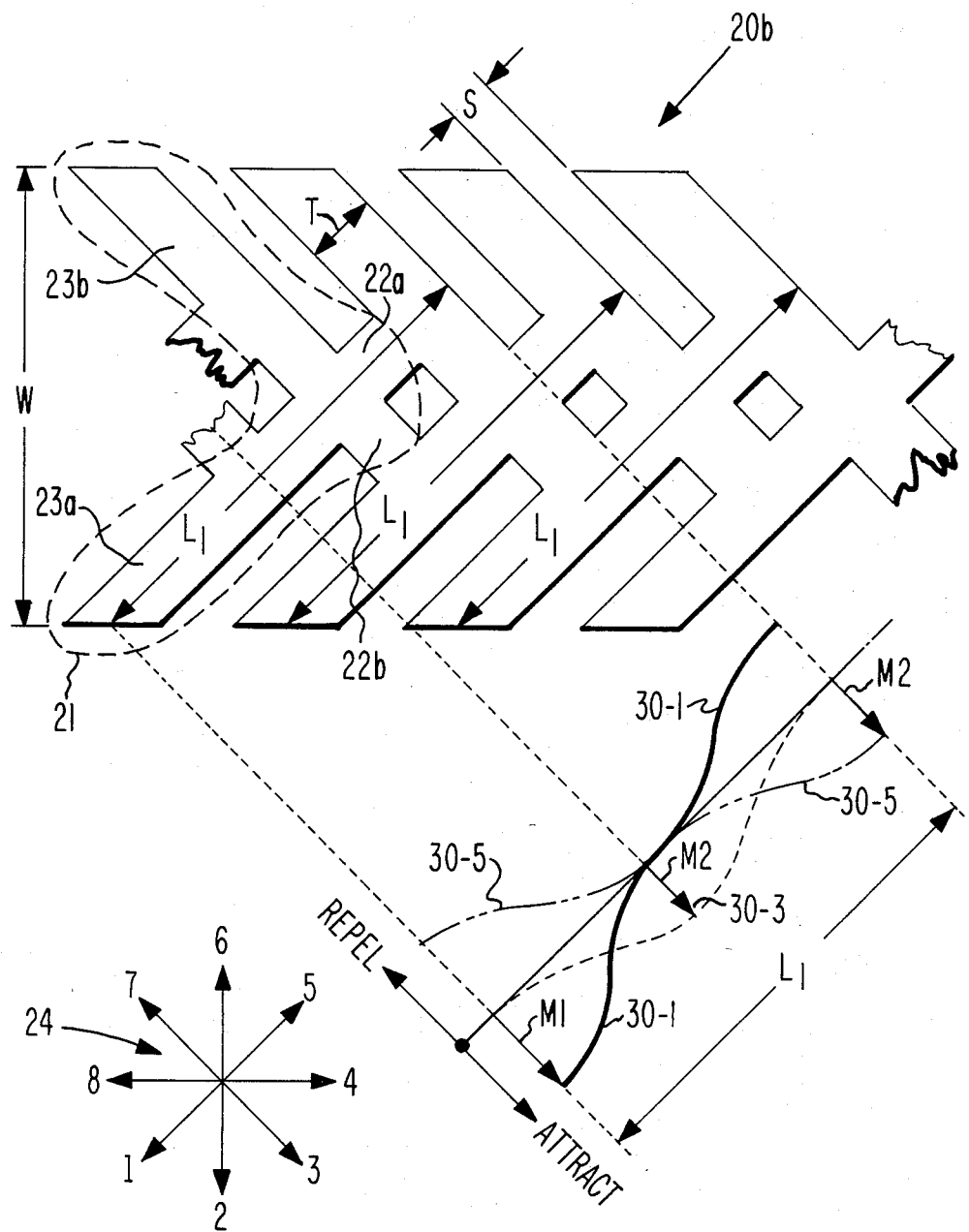
FIG. 2 illustrates the stretching operation of the structure of FIG. 1.

How each of the elements 20a–20c operates to stretch a bubble is illustrated in detail in FIG. 2. That figure includes an enlarged view of a portion of one of the stretching elements (e.g., element 20b); and it also includes a set of curves 30-1, 30-3, and 30-5 which indicate the magnetic poles that are generated in element 20b by the rotating field 24.

In particular, curve 30-1 shows the magnitude and position of the poles in element 20b when field 24 is in position 1; curve 30-3 shows the magnitude and position of the poles in element 20b when field 24 is in position 3; and curve 30-5 shows the magnitude of the poles in element 20b when field 24 is in position 5.

From curve 30-1 it is evident that a large attractive pole is generated at the open end of the long legs 23a when field 24 is in position 1. This pole is generated because when field 24 is in position 1, it is parallel to legs 23a and 22a; and thus, legs 23a and 22a operate together like a bar magnet.

Also, the magnitude of an attractive pole in a bar magnet is proportional to the magnet's length. And in FIG. 1, this length equals L1, which is the length of legs 23a and 22a plus twice the thickness T of the legs.

Thus, the magnitude of the attractive pole that is generated at the open end of the legs 23a is relatively large; and it is indicated in FIG. 2 as M1. This large magnitude is important because the rate at which a bubble stretches is proportional to the magnitude of the pole which attracts the bubble.

Next, curve 30-3 shows that when field 24 is in position 3, an attractive pole of magnitude M2 is generated along the long legs 23a at the point where they are joined by the short legs 22b. This pole is generated because when field 24 is in position 3, that field is parallel to legs 22b and 23b. Note that the magnitude M2 of the pole in position 3 is somewhat less than the magnitude M1 of the pole that is generated in position 1 since the end of leg 22b is not open but is joined by leg 23a.

Similarly, inspection of curve 30-5 shows that when field 24 is in position 5, an attractive magnetic pole of magnitude M2 is generated along legs 23b at the point where they are joined by the short legs 22a. This pole is generated because when field 24 is in position 5, that field is parallel to legs 22a and 23a. Again, since leg 22a is not open but joins leg 23b, the pole in position 5 has about the same magnitude as the pole in position 3.

Next, when field 24 is in position 7, a strong attractive pole is generated at the open ends of the legs 23b. This is because, in that position, field 24 is in alignment with legs 22b and 23b. Also, the pole in that position has the same magnitude M1 as the pole in position 1 because legs 23a and 23b form a bar magnet of length L1 with legs 23b being open.

Since the poles which are generated at the open ends of legs 23a and 23b are proportional to the long length L1, the elongated elements 20a–20c operate to stretch bubbles quite rapidly. In addition, due to the sequence and location at which the above four poles are generated, the bubbles move beneath elements 20a–20c with a wavelike motion.

Curves 30-1, 30-3, and 30-5 shown how the trough of the waves moves. In particular, note that at no time during the 360° rotation of field 24 is there a "dead zone" or "flat" zone between any two attractive poles which are sequentially generated. Thus, the bubbles always have a strong attractive pole to move them from one position to the next.

Figure 3:
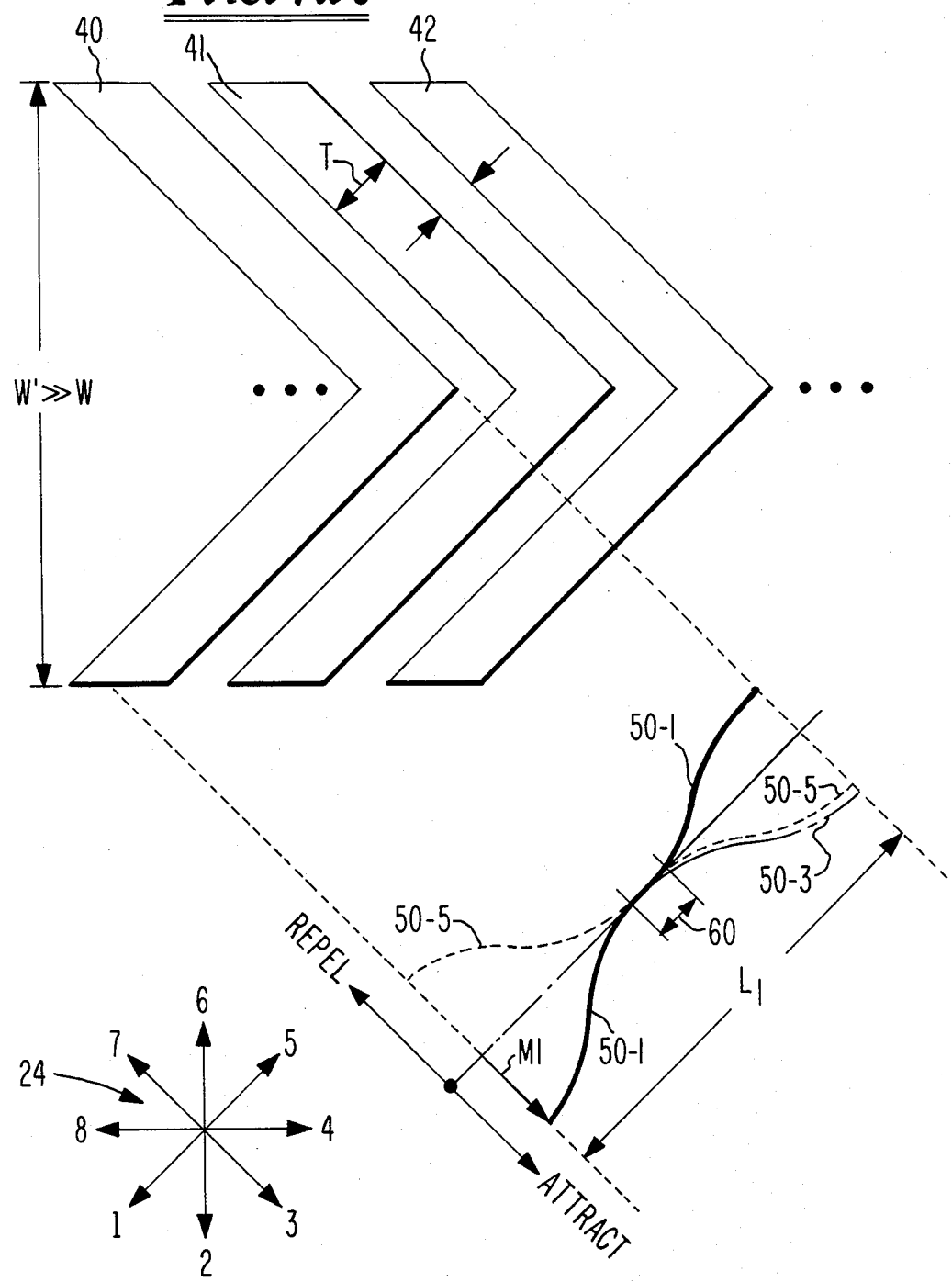
FIG. 3 illustrates, for comparative purposes, the operation of a conventional bubble-stretching mechanism.

By comparison, FIG. 3 shows an arrangement of symmetrical chevrons 40–42 which is conventionally used in a bubble memory to stretch magnetic bubbles. In this arrangement, the chevrons 40–42 lie in a row and are spaced apart from one another. Again, the sequence of three dots ( . . . ) indicates that the chevrons continue off of the page.

Also illustrated in FIG. 3 is the rotating magnetic field 24 along with a set of curves 50-1, 50-3, and 50-5 which indicate the magnetic poles that are generated in the chevrons 40–42 in response to field 24. In particular, curve 50-1 shows the magnitude and position of the poles that are generated when field 24 is in position 1; curve 50-3 shows the magnitude and position of the poles when field 24 is in position 3; and curve 50-5 shows the magnitude and position of the poles when field 24 is in position 5.

When field 24 is in position 1, it is parallel to the lower legs of the chevrons 40–42. Thus, in such position, the lower legs operate as a bar magnet to form strong attractive poles on their ends. This is indicated by curve 50-1.

Then, when field 24 is in position 3, it is parallel to the chevron's upper legs. Consequently, in that position, an attractive pole is formed at the point where the upper and lower legs of the chevron join together. Also, this pole will have a magnitude that is somewhat less than the pole in position 1 since the legs are not open at the chevron's center.

The attractive pole at the center of the chevrons 40–43 remains in that position while the magnetic field 24 rotates through positions 4 and 5. In position 4, this pole is generated in equal proportions by both the legs of the chevron; and in position 5, this pole is generated solely by the chevron's lower legs.

Subsequently, as field 24 moves through positions 6, 7, and 8 to position 1, magnetic poles are generated along the upper legs of the chevrons 40–42. And these poles are similar in strength and position to those in the lower legs of the chevron.

Now, as was explained above, the rate at which a bubble is stretched is proportional to the magnitude of the pole that attracts the bubble. Thus, in order for the FIG. 2 and 3 stretchers to stretch bubbles at the same rate, the length L1 of the chevron legs in FIG. 3 must be the same as the length L1 in FIG. 2.

One problem, however, with making the length of the legs of the chevrons in FIG. 3 equal to L1 is that the resulting structure operates as a very poor bubble propagator. This is evident by inspection of curves 50-1, 50-3, and 50-5.

In particular, curves 50-1 and 50-3 show that in moving from position 1 to position 3, the attractive poles move from the open end of the lower legs all the way to the chevron's center. Thus, at no position of the magnetic field 24 is a strong attractive pole generated midway along the chevron's legs.

Stated differently, a potential barrier or "flat region" 60 always exists at or near the midpoint of the chevron's legs. Further, this flat zone becomes more pronounced as the length of the legs in this chevron is increased. This flat zone 60 has the effect of hindering the bubble's movement and/or actually splitting the bubble into parts as it moves from one end of the chevron to the center.

Another problem with making the length of the legs of the chevrons in FIG. 3 equal to L1 is that it occupies substantially more space than the FIG. 2 stretcher. This is evident by simply measuring the widths W and W' in FIGS. 2 and 3 since the lengths L1 of those figures are the same.

Utilizing basic geometric relationships, the width W in FIG. 2 can be expressed mathematically as $W \div 2 = (L1 - T - S - T/2) \div \sqrt{2}$; and the width W' of the stretcher of FIG. 3 can be expressed mathematically as $W' \div 2 = (L1 - T/2) \div \sqrt{2}$. In these expressions, T represents the thickness of the legs of the X's and the chevrons and S represents the space between them.

Then, for example, under the conditions where T is equal to S and L1 is equal to 7T, the ratio $(W' - W) \div W \times 100\% = 40\%$. In other words, under the above conditions, the stretcher of FIG. 3 would require 40% more chip space to stretch a bubble to the same degree as the stretcher of FIG. 2.

A preferred embodiment of the invention has now been described in detail. In addition, however, many changes and modifications can be made to these details without departing from the nature and spirit of the invention. Accordingly, it is to be understood that the invention is not limited to said details but is defined by the appended claims.

What is claimed is:

1. A magnetic bubble memory of the type that includes a magnetic film, a plurality of magnetic bubbles in said film, an insulating layer over said film, and an electromagnetic structure on said insulating layer for stretching said bubbles to aid in their detection; wherein said structure is comprised of:

a plurality of elongated permalloy elements on said insulator and arranged in spaced rows with only one of said elements per row;
   each element consisting of a pattern that is X-shaped which repeats along the element in the direction of elongation;
   said X in said pattern having two short legs and two long legs;
   said pattern being repeated such that the short legs of one X join with the long legs of the next X; and wherein
   the length of each elongated permalloy element is at least one hundred times its width and is substantially longer than the stretched bubbles that it produces.

2. A memory according to claim 1 wherein the number of X's joined in each elongated permalloy element is at least one hundred.

3. A memory according to claim 2 wherein the legs of the X's in said elongated permalloy element intersect at 90°.

4. A memory according to claim 3 wherein the short legs of the X's in said elongated permalloy element are less than half the length of said long legs.

5. A memory according to claim 4 wherein the short legs of the X's in said elongated permalloy element join the long legs of the next X at midway along the long legs.

6. For use in a magnetic bubble memory, a mechanism for stretching magnetic bubbles, comprised of:

a plurality of elongated permalloy elements;
   each element consisting of a pattern that is X-shaped which repeats along the element in the direction of elongation;
   said X shape having two short legs and two long legs;
   said pattern being repeated such that the short legs of one X join with the long legs of the next X; and wherein
   said X-shaped pattern repeats at least one hundred times in each element such that each element is substantially longer than the stretched bubbles that it produces.

7. A mechanism according to claim 6 wherein the length of said elongated permalloy element is at least one hundred times the width.

8. A mechanism according to claim 6 wherein the legs of the X's in said elongated permalloy element intersect at 90°.

9. A mechanism according to claim 6 wherein the short legs of the X's in said elongated permalloy element are less than half the length of said long legs.

10. A mechanism according to claim 6 wherein the short legs of the X's in said elongated permalloy element join the long legs of the next X at midway along the long legs.

* * * * *